Figure 3:
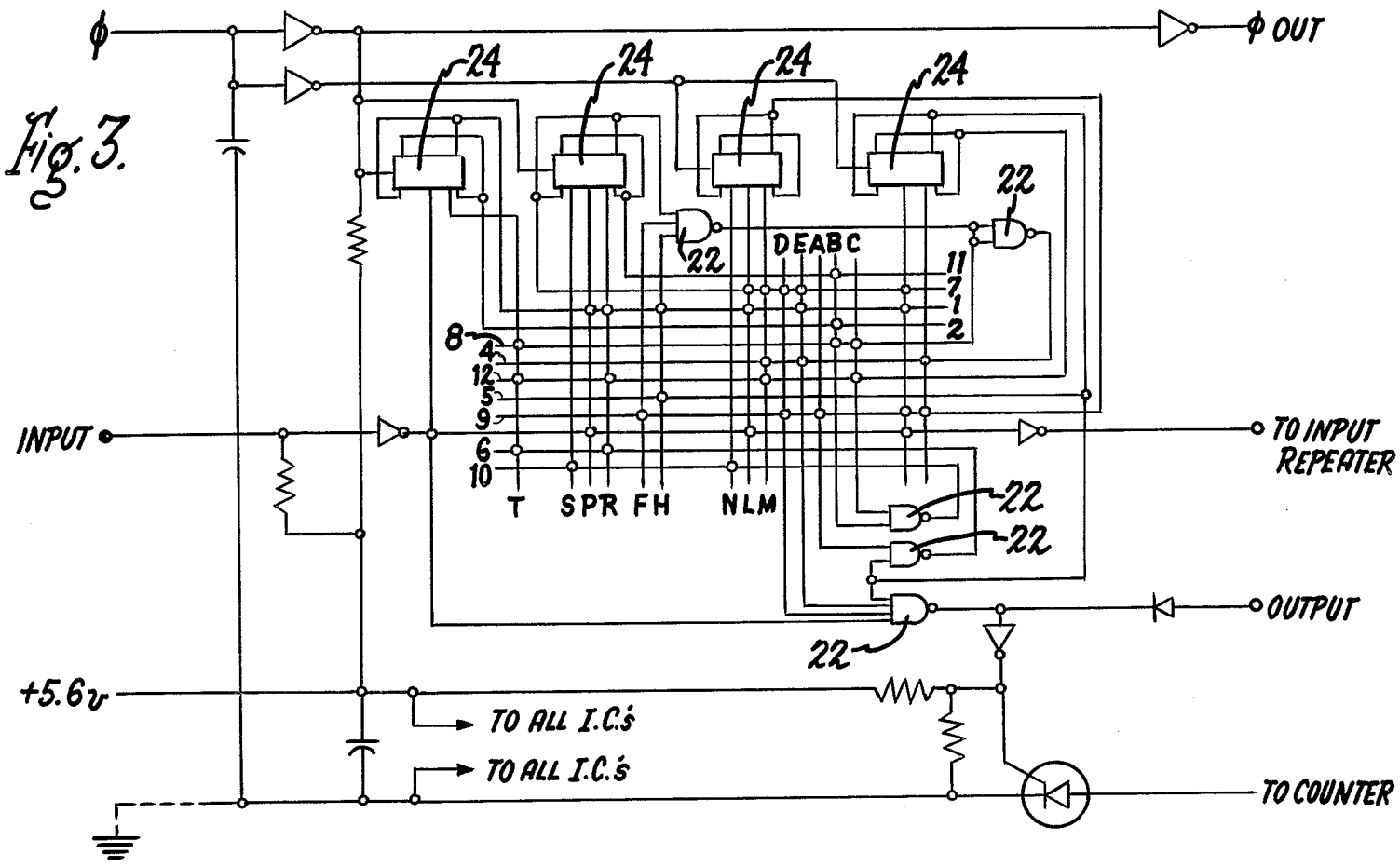

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED DECEMBER 2, 1975

941 O.G. 6

T941,006

ELECTRICAL IMPULSE DIVIDER MODULE WITH PRINTED CIRCUIT INTERCONNECT MATRIX

Richard G. Farnsworth, York, Maine, assignor to General Electric Company

Continuation of application Ser. No. 366,555, June 4, 1973. This application Aug. 23, 1974, Ser. No. 500,157

Int. Cl. H05k *5/00*

U.S. Cl. 317—101 R

2 Sheets Drawing. 9 Pages Specification

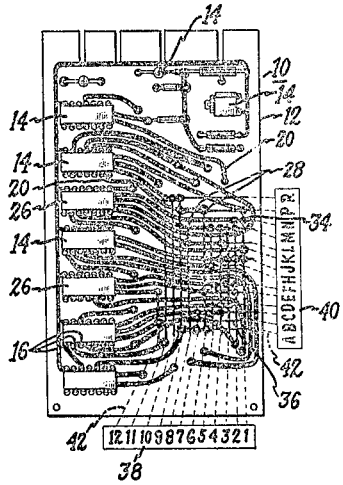

A divider circuit module for an electrical impulse totalizer is provided with an interconnect matrix including removable pins which may be rearranged to change the particular division operation of the module. The module comprises a first set of conducting strips on one side of the circuit board, the strips of the first set being connected at one end to one or more terminals of the components and having unconnected terminal locations arranged in a matrix configuration, and a second set of conducting strips on the other side of the circuit board, the strips of the second set having unconnected terminal locations arranged adjacent to, but insulated from, certain of the terminal locations of the strips of the first set. The terminal locations of the strips of the first set are disposed at a location directly opposite the terminal locations of the strips of the second set and an aperture is provided through the circuit board and through the directly opposite such terminal locations. Conductive pins extend through the apertures and are soldered on each side of the circuit board to the terminal locations of the strips of the first set and second set, respectively, as removable interconnect members which may be relocated to change the division operation of the module.

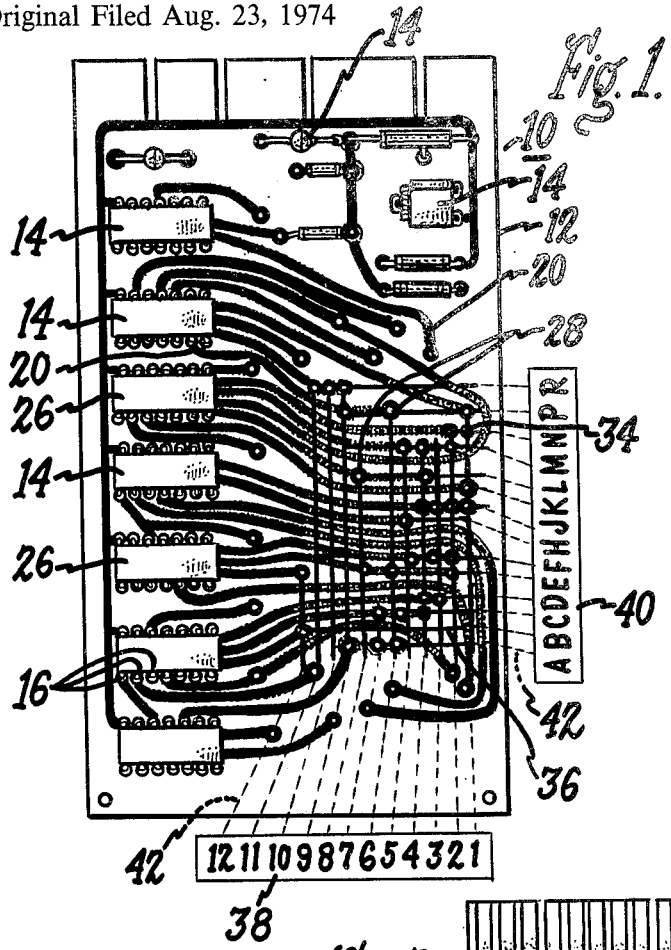
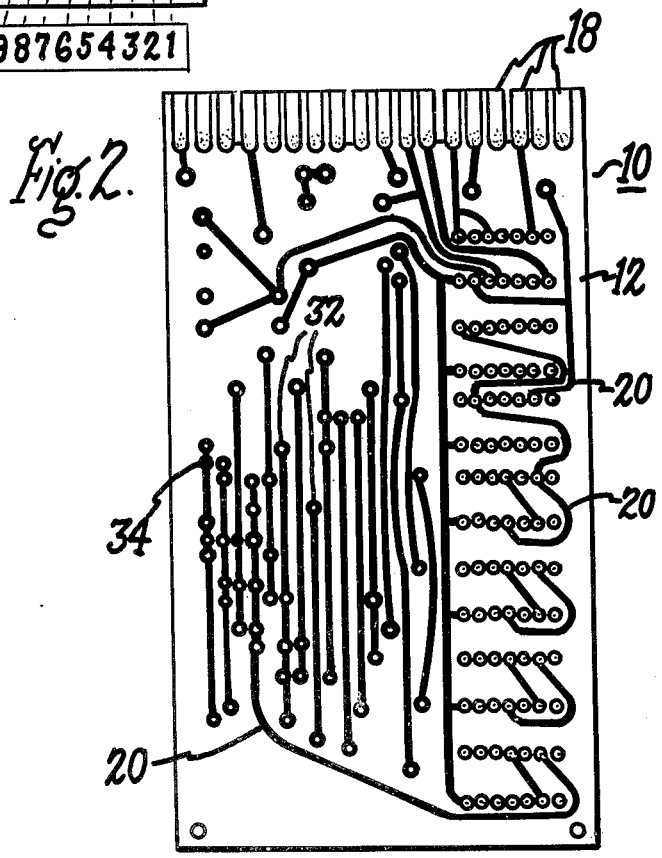

ELECTRICAL IMPULSE DIVIDER MODULE WITH PRINTED CIRCUIT INTERCONNECT MATRIX
Original Filed Aug. 23, 1974